US006242548B1

(12) United States Patent
Duchesne et al.

(10) Patent No.: US 6,242,548 B1
(45) Date of Patent: Jun. 5, 2001

(54) FLUOROPLASTIC POLYMERS WITH IMPROVED CHARACTERISTICS

(75) Inventors: Denis Duchesne, Woodbury, MN (US); Harald Kaspar; Gernot Loehr, both of Burgkirchen (DE); Attila A. Molnar, Vadnais Heights, MN (US); Klaus Hintzer, Woodbury, MN (US); Maria P. Dillon, St. Paul, MN (US); Susan S. Woods, Shoreview, MN (US); Kirsten J. Fronek, Woodbury, MN (US); Friedrich Kloos, Kastl (DE)

(73) Assignee: Dyneon LLC, Oakdale, MN (US)

( * ) Notice: Subject to any disclaimer, the term of this patent is extended or adjusted under 35 U.S.C. 154(b) by 0 days.

(21) Appl. No.: 09/311,111

(22) Filed: May 13, 1999

(51) Int. Cl.$^7$ .................................................. C08F 214/22
(52) U.S. Cl. ......................... 526/255; 526/242; 526/250; 526/253; 526/254
(58) Field of Search .................................. 526/255, 250, 526/253, 254

(56) References Cited

U.S. PATENT DOCUMENTS

| | | | |
|---|---|---|---|
| 4,262,101 | 4/1981 | Hartwimmer et al. | 526/89 |
| 4,859,836 | 8/1989 | Lunk et al. | 219/548 |
| 5,549,948 | 8/1996 | Blong et al. | 428/36.9 |
| 5,656,121 | 8/1997 | Fukushi | 156/326 |
| 5,658,670 | 8/1997 | Fukushi et al. | 428/421 |
| 5,804,670 | 9/1998 | Stoeppelmann | 525/420 |
| 5,855,977 | 1/1999 | Fukushi et al. | 428/36.6 |

FOREIGN PATENT DOCUMENTS

| | | |
|---|---|---|
| 0 312 077 B1 | 1/1994 | (EP) . |
| 0 670 353 | 9/1995 | (EP) . |
| 0 824 059 A1 | 2/1998 | (EP) . |
| 0 967 248 | 12/1999 | (EP) . |
| WO 98/08679 | 3/1998 | (WO) . |
| WO 99/00249 | 1/1999 | (WO) . |
| WO 99/00454 | 1/1999 | (WO) . |

OTHER PUBLICATIONS

"*Modern Fluoropolymers*", 1997 John Wiley & Sons Ltd., THV Fluoroplastic, p. 257.

Primary Examiner—Fred Zitomer
(74) Attorney, Agent, or Firm—James V. Lilly

(57) ABSTRACT

A multimodal fluoroplastic terpolymer composition is provided. The terpolymer can be extruded at high extrusion speeds without having to reduce its molecular weight. The terpolymer is useful by itself; in combination with conductive fillers to provide an electrostatically dissipative composition; and as a polymer processing aid. The polymer has a low molecular weight component, a high molecular weight component and, optionally an ultra-high molecular weight component.

17 Claims, No Drawings

FLUOROPLASTIC POLYMERS WITH IMPROVED CHARACTERISTICS

DESCRIPTION

1. Field of the Invention

The invention pertains to a melt processable, multimodal, partially crystalline fluoropolymer. More particularly it relates to a multimodal fluoroplastic terpolymer of (i) vinylidene fluoride and (ii) at least two ethylenically unsaturated monomers of the formula $CF_2=CFR_f$ where $R_f$ is F or a perfluoroalkyl of 1 to 8, preferably 1 to 3, carbon atoms.

2. Background

Partially crystalline fluoroplastic terpolymers of tetrafluoroethylene (TFE) vinylidene fluoride (VDF) and hexafluoropropylene (HFP) are available from Dyneon LLC and Dyneon GmbH under the name "Dyneon™ THV". These fluoroplastic materials and their wide range of uses is described in more detail in "Modem Fluoropolymers", Wiley, 1997, p. 257. They typically are derived from monomer compositions comprising from 30–70 weight % TFE, 5–40 weight % HFP and 5–55 weight % VDF and have a melting point range of 75° C. to 275° C.

Because of their relatively low melting point, fluoroplastics of this type can be easily coextruded with standard non-fluorinated thermoplastics (i.e., polyethylene, polypropylene, nylon, etc.) using standard extrusion equipment. That means that corrosion-resistant extrusion equipment is generally not needed. This permits the formation of a variety of products, including hose and fuel-line designs such as those disclosed in U.S. Pat. No. 5,804,670 and EP 824059. In such designs, the fluoroplastic provides a chemically resistant permeation barrier.

Very high extrusion speeds are usually used with the standard thermoplastics. However, the commercially available fluoroplastics can usually only be processed at relatively modest or moderate extrusion speeds. At high extrusion speeds, the extrusion process begins to run erratically and the extrudate exhibits regular fluctuations in thickness (the extrudate "breathes"). At even higher extrusion speeds, beginning at a so-called critical shear rate, particularly undesirable surface defects occur which appear in the form of a series of scale-like melt fracture ("sharkskin"). The typical critical shear rate of the standard commercially available fluoroplastics lies between 50 and 100 $s^{-1}$ at 265° C. The maximum coextrusion speed of standard thermoplastics with standard fluoroplastics is thus usually limited by the onset of these shear rate related surface defects of the extrudate.

In order to extrude fluoroplastics at the high extrusion speeds typically used with standard thermoplastics, it has been necessary to use low molecular weight fluoroplastics. However, this results in a loss of the mechanical properties (e.g. tensile strength at break, elongation at break, burst pressure of the extrudate.

For these and other reasons, there exists a need for a fluoroplastic terpolymer that can be melt processed at the high extrusion speeds of standard thermoplastics.

SUMMARY OF THE INVENTION

The present invention provides a fluoroplastic terpolymer that can be extruded at the high extrusion speeds of standard polymers without the need to lower the molecular weight of the fluoroplastic. The terpolymer has significantly improved processability as it postpones the onset of melt fracture ("sharkskin") or other irregularities such as thickness fluctuations. With the polymer of the present invention, the critical shear rate is an order of magnitude higher than it is with the standard types of commercially available fluoroplastics. In some aspects of the invention the critical shear rate 265° C. is increased to more than 1000 $s^{-1}$. Moreover, as the measurement of the melt viscosity before and after extrusion shows, this is achieved without any perceptable degradation of the terpolymer.

The polymer of the invention also offers additional advantages, in the production of thin-wall articles by means of extrusion or coextrusion; in injection molding; in use as an electrostatically dissipative (ESD) fluoroplastic; and in use as a processing additive for melt processable hydrocarbon polymers. The improved injection molding behavior, especially in the case of complicated shapes, and the improved extrusion of hydrocarbon polymers, is particularly noticeable.

With the materials in accordance with the invention, the extrusion of pipes at an increased extrusion throughput is attained as compared to that attained with standard commercially available fluoroplastics. Surprisingly, this is achieved while maintaining the physical properties of the terpolymer. It has also been found that molded objects can be created at lower temperatures so the final products have more dimensional stability and can be more highly loaded. Additionally, the final products can be made under conditions that are less likely to lead to discoloration and/or degradation.

As disclosed above, the polymer of the invention is also useful in the manufacture of ESD fluoroplastics. ESD fluoroplastics are often used in the hoses and fuel lines of motor vehicles. ESD plastics comprise a mixture of carbon and a polymer. As is the case with essentially all of the ESD polymers, the melt viscosity of the starting polymer is substantially increased because of the addition of carbon. Consequently, the ESD polymer becomes more difficult to process. To overcome this difficulty, the melt viscosity of the starting polymer is reduced. See EP 0 312 077 B1, for example, where the molecular weight of the polymer is lowered to reduce the melt viscosity. The reduction of the molecular weight fundamentally worsens the mechanical properties such as elongation at tear and the ultimate tensile strength, for example. As noted above, the molecular weight of the polymer of the invention is not reduced in order to extrude it at higher rates. As a result, the mechanical properties of the extrudate are maintained.

Surprisingly, even as an ESD grade of fluoroplastic, the polymer of the invention can be extruded twice as quickly as commercially available virgin fluoroplastic material without the occurrence of any melt fracture or other surface defects. The resulting smooth surface is beneficial in fuel line applications as it reduces turbulent flow of the fuel through the line and reduces the occurrence of fuel line deposits.

In addition to the advantages disclosed above, the polymer of the invention can be used as a processing additive to provide a melt processable polymer composition. Use of the polymer composition of the invention in this way significantly improves the melt processability of melt processable polymers by either reducing the occurrence of melt defects in a host polymer or by postponing the onset of such defects to higher extrusion rates than is achieved without the use of a processing aid or with the use of other fluoropolymer-based processing aids.

In accordance with the present invention there is provided a multimodal terpolymer derived from interpolymerized units of (i) vinylidene fluoride and (ii) at least two ethylenically unsaturated monomers of the formula $CF_2=CFR_f$ where $R_f$ is fluorine or perfluoroalkyl of 1 to 8, preferably 1 to 3, carbon atoms. As used herein the term multimodal terpolymer means a terpolymer having two or more discrete molecular weight ranges.

The multimodal terpolymer has a relatively low molecular weight component (A), a relatively high molecular weight component (B) and, optionally an ultrahigh molecular weight component (C). Preferably terpolymers contain no more than two to three of the discrete molecular weight components.

Component A of the polymer has a very low molecular weight. The molecular weight of component B lies within the range of molecular weights of the commercially fluoroplastic products such as the THV materials available from Dyneon. The ultrahigh molecular weight component C of the fluoropolymer is such that this component cannot be processed thermoplastically (i.e., melt processed) under normal melt processing conditions without degrading. A measure of the molecular weight is the melt flow index (MFI).

The exact values for $MFI_A$, $MFI_B$, and MFIc are determined by a number of factors including the way in which the multilodal polymer is to be used. Thus, for example, a multimodal polymer to be used as a high speed extrusion grade material, as an ESD grade material or as a processing additive for hydrocarbon polymers, will preferably have an $MFI_A$ of Component A of from greater than 50, an $MFI_B$ of Component B of from 1 to 50, and an $MFI_C$ of Component C of less than 1. However, if the multimodal polymer is to be used as a processing additive for non-hydrocarbon polymers, the MFI of Component a may be greater than 100 while the MFI of Component B may be from 1 to 100. The MFI values are determined according to the procedures described below.

Also provided in accordance with the present invention is an ESD composition comprising an electrically conductive particulate material and the terpolymer of the invention.

Also provided herein is a melt processable polymer composition comprising a major amount (e.g., at least 50% by weight) of a melt processable, thermoplastic host polymer, and a minor amount of the terpolymer of the invention as described above. The present invention also comprises a method of improving the melt processability of a thermoplastic host polymer by combining an effective amount of the terpolymer of the invention as described above with the host polymer blending the materials, preferably until there is a uniform distribution of the two, and melt processing the resulting blend. As used in this context, an effective amount is that which reduces the occurrence of melt defects during extrusion of the thermoplastic as compared with a thermoplastic using a commercially available terpolymer, or delays the onset of such defects to a higher shear rate during such extrusion.

DETAILED DESCRIPTION

The terpolymer of the invention is semi-crystalline, generally has a peak melting temperature in the range of 60° C. to 300° C., and preferably has a hydrogen content of less than 5% by weight. They are polymers containing interpolymerized units derived from (i) vinylidene fluoride, and (ii) at least two separate ethylenically unsaturated, copolymerizable fluorinated comonomers that each have the general structure $CF_2=CFR_f$ wherein $R_f$ is F, or a perfluoroalkyl of 1 to 8, preferably 1 to 3, carbon atoms, e.g., tetrafluoroethylene, hexafluoropropylene, etc.

Preferably the terpolymers comprise interpolymerized units derived from polymerizing a combination of (i) from 5 to 55 weight percent of vinylidene fluoride, and (ii) from 5 to 70 weight percent at least two monomers of the formula $CF_2=CFR_f$ A preferred subclass of terpolymers comprises interpolymerized units derived from the polymerization of vinylidene fluoride, hexafluoropropylene and tetrafluoroethylene. This terpolymer is typically derived from a polymerization mixture made up of (i) 5 to 55 weight percent (preferably 15 to 45 weight percent) vinylidene fluoride, (ii) 30 to 70 weight percent (preferably 35 to 65 weight percent) tetrafluoroethylene, and (iii) 5 to 40 weight percent (preferably from 10 to 25 weight percent) of hexafluoropropylene. A preferred species of this terpolymer contains interpolymerized units derived from a monomer charge of 15 to 35 weight percent vinylidene fluoride, 45 to 65 weight percent tetrafluoroethylene, and 10 to 20 weight percent hexafluoropropylene.

The chemical composition of the individual components A, B and C of the terpolymer does not have to be the same, but can vary within a wide range. Typically, the components are present as separate polymers.

Generally the ratio of $MFI_A:MFI_B$ is at least 2:1. Preferably the ratio is from 2:1 to 300:1. For high speed extrusion applications the ratio is preferably in the range of from 10:1 to 300:1. For ESD applications the ratio is preferably from 20:1 to 300:1. For processing additive applications, the ratio is preferably from 2:1 to 100:1 more preferably from 5:1 to 50:1.

Even though the multimodal terpolymer of the invention comprises at least two components of different molecular weight, and hence different MFI values, it possesses an overall MFI value ($MFI_O$). Typically this value is in the range of from 1 to 500. For ESD applications, $MFI_O$ is preferably from 1–50 more preferably from 2 to 40. For processing additive applications, $MFI_O$ is preferably from 5–100. Surprisingly the multimodal terpolymer performs more effectively than a comparable unimodal terpolymer of the same or a similar overall MFI value.

The ratio of the high molecular weight component (A) to the low molecular component B can fluctuate within wide limits. In general, the ratio is in the range of 1:99 to 99:1 parts by weight of A:B. In particular, the ratio is preferably in the range of from 1:99 to 2:80, more preferably from 75:25 to 25:75. Most preferably the ratio A:B in the range of from 60:40 to 40:60 parts by weight for ESD grades of the terpolymer and from 10:90 to 45:65, parts by weight of A:B for a processing additive application.

The amount of the ultrahigh molecular weight component (C) typically amounts to from 0 to 15% by weight of the total weight of components A and B.

The polymer composition of the invention can be produced in a number of ways. For example, it may be produced by mixing either the latexes or the powder products of the separate components. Preferably, the polymer is prepared by mixing the latexes of the components (so-called latex blending) and subsequently finishing the mixture as disclosed in U.S. Pat. No. 4,262,101. Alternatively, the mixture may be finished by mechanical precipitation by means of a homogenizer and subsequent treatment with gasoline. After subsequent drying, the product is preferably subjected to a melt pelletization. Especially homogenous mixtures are obtained as a result of the latex blending.

The terpolymer of the invention can also be produced by means of a suitable polymerization process ("step polymerization"). This process employs the use of specific initiators and chain transfer agents such as short-chain alkanes and halogen alkanes plus hydrogen. Preferably, the process is carried out in the manner described below. At the beginning of the polymerization, relatively little initiator and relatively little chain transfer agent are charged to the reaction vessel for a desired high melting viscosity. As the polymerization proceeds, additional initiator and chain transfer agent are charged to the reaction vessel. The exact timing and quantity of these charges will effect the polymerization conditions and permit the operator to produce a polymer having the desired characteristics. For example, after 50% of the tetrafluoroethylene has been added, the further addition of appropriate amounts of initiator and chain transfer agent can be used to change the polymerization conditions and produce a polymer with a desired low melting viscosity. A desired low melting viscosity can also be achieved by increasing the temperature during the polymerization. The advantage of this production method is the fact that a "perfect" mixing of the two components can be created in situ. The technical effort is reduced as a result.

As previously disclosed herein, the multimodal terpolymer is useful in an ESD fluoroplastic composition. In this aspect of the invention, the ESD terpolymer composition comprises a major amount of the multimodal terpolymer, up to 20% by weight of a conductive material, and a minor amount, up to 5% of another melt processable thermoplastic material, preferably a hydrocarbon polymer. The ESD terpolymer composition preferably contains 2 to 10 wt % of the conductive material and 0.1 to 3 wt % of the hydrocarbon polymer. While a wide variety of conductive fillers are useful, the most commonly employed conductive materials are carbon black and graphite. Likewise, a variety of hydrocarbon polymers may be used as the other melt processable thermoplastic material. Such materials are preferably fluid at the processing temperature of the terpolymer. Additionally, the hydrocarbon polymer is preferably immiscible with the terpolymer. Preferably, the hydrocarbon polymers are olefin polymers of the type disclosed in U.S. Pat. No. 5,549,948, col. 2, line 52 to col. 4, line 60 incorporated herein by reference.

The multimodal fluoropolymer of this invention and ESD fluoroplastics based on it can be easily co-processed (for example coextruded) with a variety of thermoplastic and elastomeric polymers in the fabrication of multi-layer articles such as hoses, tubes, films, sheets, wire coatings, cable jackets, containers, pipes, etc. Examples of polymers that can be co-processed with the terpolymer of the invention and the ESD fluoroplastic composition of the invention include polyamides, polyimides, polyurethanes, polyolefins, polystyrenes, polyesters, polycarbonates, polyketones, polyureas, polyacrylates and polymethacrylates. The particular thermoplastic polymer selected will depend upon the application or desired properties.

Polyamides that can be co-processed with the fluoropolymer and fluoropolymer compositions of the invention are generally commercially available. For example, polyamides such as any of the well-known nylons are available from a number of sources. Particularly preferred polyamides are nylon-6, nylon-6,6, nylon-11, nylon-12, and nylon-6-636. It should be noted that the selection of a particular polyamides material should be based upon the physical requirements of the particular application for the resulting article. For example, nylon-6 and nylon-6,6 offer higher heat resistance properties than nylon-11 or nylon-12, whereas nylon-11 and nylon-12 offer better chemical resistant properties. In addition to those polyamide materials, other nylon materials such as nylon-6, 12, nylon-6,9, nylon4, nylon-4,2, nylon-4, 6, nylon-7, and nylon-8 may also be used. Ring containing polyamides, e.g., nylon-6, T and nylon-6,1, may also be used. Polyether containing polyamides, such as PEBAX polyamides (Atochem North America, Philadelphia, Pa.), may also be used.

Useful co-processable polyurethane polymers include aliphatic, cycloaliphatic, aromatic, and polycyclic polyurethanes. These polyurethanes are typically produced by reaction of a polyfunctional isocyanate with a polyol according to well-known reaction mechanisms. Useful diisocyanates for employment in the production of a polyurethane include dicyclohexylmethane-4,4'-diisocyanate, isophorone diisocyanate, 1,6-hexamethylene diisocyanate, cyclohexyl diisocyanate, and diphenylmethane diisocyanate. Combinations of one or more polyfunctional isocyanates may also be used. Useful polyols include polypentyleneadipate glycol, polyetramethylene ether glycol, polyethylene glycol, polycaprolactone diol, poly-1,2-butylene oxide glycol, and combinations thereof Chain extenders, such as butanediol or hexanediol, may also optionally be used in the reaction. Commercially available urethane polymer useful in the present invention include: PN-3429 from Morton International, Seabrook, N.H., and X-4107 from B.F. Goodrich Company, Cleveland, Ohio.

The polyolefin polymers that can be co-processed are generally homopolymers or copolymers of ethylene, propylene, acrylic monomers, or other ethylenically unsaturated monomers, for example, vinyl acetate and higher alpha-olefins. Such polymers and copolymers can be prepared by conventional free-radical polymerization or catalysts of such ethylenically unsaturated monomers. The degree of crystallinity of the olefin polymer or copolymer can vary. The polymer may, for example, be a semi-crystalline high density polyethylene or may be an elastomeric copolymer of ethylene and propylene. Carboxyl, anhydride, or imide functionalities may be incorporated into the hydrocarbon polymer within the present invention, by polymerizing or copolymerizing functional monomers, for example, acrylic acid or maleic anhydride, or by modifying a polymer after polymerization, for example, by grafting, by oxidation or by forming ionomers. These include, for example, acid modified ethylene vinyl acetates, acid modified ehtylene acrylates, anhydride modified ethylene acrylates, anhydride modified ethylene vinyl acetates, anhydride modified polyethylenes, and anhydride modified polypropylenes. The carboxyl, anhydride, or imide functional polymers useful as the hydrocarbon polymer are generally commercially available. For example, anhydride modified polyethylenes are commercially available from DuPont, Wilmington, Del., under the trade designation BYNEL coextrudable adhesive resins.

Polyacrylates and polymethacrylates useful that can be co-processed include, for example, polymers of acrylic acid, methyl acrylate, ethyl acrylate, acrylamide, methylacrylic acid, methyl methacrylate, and ethyl acrylate, to name a few. As mentioned above, other useful substantially non-fluorinated co-processable polymers include polyesters, polycarbonates, polyketones, and polyureas. These materials are generally commercially available, for example, SELAR polyester (DuPont, Wilmington, Del.), LEXAN polycarbonate (General Electric, Pittsfield, Mass.), KADEL polyketone (Amoco, Chicago, Ill.), and SPECTRIM polyurea (Dow Chemical, Midland, Mich.).

Examples of co-processable elastomeric polymers include acrylonitrile butadiene (NBR), butadiene rubber, chlorinated and chloro-sulfonated polyethylene, chloroprene, EPM, EPDM, epichlorohydrin (ECO), isobutylene isoprene, isoprene, polysulfide, polyurethane, silicone, PVC-NBR, styrene butadiene, and vinyl acetate ethylene. Examples of these compounds include Nipol 1052 NBR (Zeon, Louisville, Ky.), Hydrin 2000 ECO (Zeon, Louisville, Ky.), Hypalon 48 (Dupont, Wilmington, Del.), and Nordel 2760P EPDM (Dupont, Wilmington, Del.).

The co-processing of fluoropolymers is further described in U.S. Patent 5,656,121, U.S. Pat. No. 5,658,670, U.S. Pat. No. 5,855,977, WO 98/08679, WO 99/00249, and WO 99/00454, which discloses composite articles employing a fluorine-containing polymer. The multimodal fluoropolymers and ESD polymers of the present invention may be used as the fluorine-containing polymer in such composite articles. Such articles include two, three and more than three layer composite articles. The articles may employ a tie layer to join the fluoropolymer to the other layers.

In addition to its utilities in standard extrusion and as an ESD fluoroplastic composition, the multimodal terpolymer of the invention is useful as a polymer processing additive. In this aspect of the invention, the multimodal terpolymer is combined with a thermoplastic, or melt processable, host polymer to improve its melt processability. The amount of the terpolymer necessary to provide a desired improvement (e.g., a reduction in sharkskin or other melt defect phenomena) will depend upon a number of factors including the particular melt-processable polymer used, the formulation of that polymer (i.e., the amount and types of additives present), and the process conditions under which the composition is to be extruded.

Generally, the terpolymer, when used as a process additive, is present at a low concentration. The exact concentration present may vary depending upon whether the melt-processable composition is to be extruded into its final form (e.g., a film) or whether the melt-processable composition is to be used as a masterbatch and is to be further diluted with melt processable polymer before it is extruded into its final form. Generally, the terpolymer comprises from about 0.005 and 50 weight percent of the melt processable composition. If the melt-processable composition is a masterbatch, the amount of the terpolymer may vary between about 2 to 50 weight percent of the composition. If the melt processable composition is to be extruded into final form and is not further diluted by the addition of melt processable polymer, the melt-processable composition typically contains a lower concentration of the terpolymer, e.g., about 0.005 to 2 weight percent, and preferably about 0.01 and 0.2 weight percent of the melt-processable composition. In any event, the upper concentration of the terpolymer in the melt-processable composition generally is determined by economic limitations rather than by any adverse physical effect of the concentration of the processing aid.

The use of the terpolymer of the present invention is further described in copending application Ser. No. 09/311,107, filed of even date herewith incorporated herein by reference.

The host polymers to which the terpolymer process additive can be added include any of those that are co-processable with the fluoropolymer as disclosed above. These include, but are not limited to, polyamides, polyimides, polyurethanes, polyolefins, polystyrenes, polyesters, polycarbonates, polyketones, polyurethanes, polyvinyl resins, polyacrylates and polymethylacrylates. A particularly useful class of host polymers useful in the invention are polyolefins. Such polymers may be obtained by the homopolymerization or copolymerization of olefins or by the copolymerization of one or more olefins with one or more monomers that are copolymerizable with such olefins, e.g. vinyl ester compounds such as vinyl acetate.

Representative examples of these polymers are polyethylene, polypropylene, poly(1-butene), poly(3-methylbutene), poly(4-methylpentene) and copolymers of ethylene with propylene, 1-butene, 1-hexene, 1-octene, 1-decene, 4-methyl-1-pentene, and 1-octadecene.

Representative blends of thermoplastic hydrocarbon host polymers useful with the multimodal processing additive are blends of polyethylene and polypropylene, linear or branched low-density polyethylenes, high-density polyethylenes, and polyethylene and olefin copolymers containing said copolymerizable monomers, some of which are described above, e.g., ethylene and acrylic acid copolymers; ethylene and methyl acrylate copolymers; ethylene and ethyl acrylate copolymers; ethylene and vinyl acetate copolymers; ethylene, acrylic acid, and ethyl acrylate copolymers; and ethylene, acrylic acid, and vinyl acetate copolymers.

The present invention is further illustrated in the following representative examples. The methods used to determine various physical properties of the polymers is first described.

Measurement Methodology

The measurement of the MFI value for the low and high molecular weight components was carried out in accordance with DIN 53735, ISO 12086 or ASTM D-1238 at a support weight of 5 kg and a temperature of 265° C. The MFIs cited here were obtained with a standardized extrusion die of 2.1 mm diameter and a length of 8 mm. In the case of narrowly distributed unimodal test samples, the MFI represents one point in the Newtonian viscosity range.

The melting peaks of the terpolymers were determined by means of a Perkin-Elmer DSC 7.0 under a nitrogen flow and a heating rate of 10° C./min. The indicated melting points relate to the melting peak maximum.

Critical Shear Rate was determined at 265° C. according to ASTM D-3835-96 or ISO 11443 using a Goettfert capillary rheometer model "Rheotester 1000". A variety of plunger speeds were used in ascending order and the shear rate at which melt fracture first became detectable was recorded. Critical Shear Rate is reported in reciprocal seconds ($s^{-1}$).

Percentage and ratio data in the following examples are relative to the weight unless otherwise indicated. Additionally the low, high and ultra-high molecular weight terpolymers are referred to as A, B and C respectively. The numerical designation following each alphabetic reference merely distinguishes the polymers of a particular weight from each other.

Polymerization Procedure and Preparation of Polymer B1

A polymerization reactor with a total volume of 190 liters which was provided with an impeller agitator was charged with 110 liters of demineralized water and 105 g of ammonium perfluoroctanoate in the form of a 30% solution, 200 g ammonium oxalate and 114 g malonic acid diethyl ester (referred to in the following as MADE). After sealing the reactor, the atmospheric oxygen was removed by alternating evacuation and flushing with nitrogen, and the boiler was heated to 40° C. The mixer was set to 210 rpm. HFP was then added until a pressure of 8 bar absolute was attained. Reaction pressure was then applied to 9 bar absolute with VDF and to 15 bar absolute with TFE. The polymerization was started by pumping in 50 ml of a potassium permanganate solution (2.62%). As soon as the pressure started to fall, additional TFE, HFP and VDF was added over the gas phase in the weight ratio of 0.313 for HFP/TFE and 0.430 for VDF/TFE, so that the overall pressure of 15.0 bar was maintained. During the polymerization, 85 ml/h of a 2.62% potassium permanganate solution was continuously added. The heat that was released was removed by cooling the boiler wall, thus keeping the temperature at a constant 40° C. Following the addition of a total of 33.4 kg of TFE into the reactor, the addition of the monomer was interrupted (polymerization time: 5 h, 40 min), and the reactor was depressurized and flushed several times with $N_2$.

The obtained quantity of 171.7 kg of polymer latex with a solids content of 33.2% was left at the bottom of the reactor. After it had been transferred into a 250-liter external mixer vessel, the latex was filled up to 100 liters with demineralized water, was treated with 2.5 liters of concentrated hydrochloric acid, and mixed until the solid material had separated from the aqueous phase. The flaky powder that had been stirred out was granulated with 36 liters of perfluoroheptane (PF 5070 from 3M Company), the perfluoroheptane was expelled with steam. It was then washed six times, each time with vigorous, thorough mixing with 100 liters of demineralized water. The damp powder was dried for 12 hours in a drying oven at 100° C. In this way, 58 kg of a terpolymer was obtained which contained a proportion by weight of 57% TFE, 18% HFP and 25% VDF. This terpolymer exhibits a melting point of 163° C. and an MFI of 11.8.

In the description of the latex mixtures, this terpolymer will be referred to as "high molecular weight component B1" in the following examples. Terpolymer B1 has properties similar to those of THV 500 G.

Preparation of Terpolymer Components

The polymerization recipe described in the Polymerization Procedure was varied with regard to the amount of MADE used as well as with regard to the speed of the metered addition of 2.62% potassium permanganate solution, while all of the other conditions remained the same.

The test results of the obtained terpolymer are summarized in the following table (Table 1).

TABLE 1

| Terpolymer Component | Melting Point (° C.) | MFI |
| --- | --- | --- |
| A1 | 167 | 68 |
| A2 | 166 | 430 |
| A3 | 166 | 380 |

TABLE 1-continued

| Terpolymer Component | Melting Point (° C.) | MFI |
| --- | --- | --- |
| A4 | 163 | 130 |
| B1 | 163 | 11.8 |
| B2 | 164 | 3.2 |
| B3 | 163 | 1.8 |
| B4 | 165 | 12.7 |
| B5 | 166 | 24 |
| B6 | 162 | 10 |
| C1 | 164 | 0.001 |
| C2 | 162 | 0.001 |
| C3 | 165 | 0.003 |

EXAMPLES 1–6 AND FIRST AND SECOND COMPARATIVE EXAMPLES

A series of terpolymer latex mixtures were produced from the terpolymers mentioned above. The latex mixtures were worked up as in the Polymerization Procedure, and were then melt-pelletized in the double screw extruder. The mixing ratios of the low molecular component A, the high molecular component B and the ultrahigh molecular component C, as well as several properties of these mixtures are shown in Table 2 in comparison with the terpolymer B1.

Press plates were produced from the melt granulates of the described mixtures 1–6, which were then compared with the standard terpolymer B1 (MFI of 11.8) in terms of their mechanical properties. The production of the press plates (diameter 130 mm) was carried out in a sintering press from the firm of Collin at a temperature of 220° C. and a pressure of 53 bar. Following a holding period of 10 min, the molded objects were cooled to room temperature at a cooling rate of 30° C./min under continuing pressure. Moduli of elasticity were determined in accordance with ASTM D648 on test bars punched from these press plates, while the yield stresses (STSP), ultimate tensile strengths (RFK) and elongations at tear (RD) were determined in accordance with ISO 12086.

As can be seen in the tables which follow, the mixtures had physical properties comparable to as those of the standard terpolymer B1.

Particularly worth noting is the fact that mixture 3 possessed a critical shear speed that had increased by a factor of >50 when compared to the standard terpolymer B1. In the case of mixture 4, the critical shear speed had increased by a factor of 20 in comparison with the standard terpolymer B1, and with mixture 5, by a factor of 8.

TABLE 2

| Mixture | Mixture Portions | | | Mod. of elas./ MPa | Mechanical Properties | | | | Critical Shear Rate$(s^{-1})$ |
| --- | --- | --- | --- | --- | --- | --- | --- | --- | --- |
| | Portion A | Portion B | Portion C | | STSP/ MPa Yield Stress | RFK/ Mpa Ultimate Tensile | RD in % Elong @ Tear | $MFI_O$ | |
| First Comparative | | | | | | | | | |
| Standard Terpolymer | | 100% B1 | | 165 | 9.3 | 23.7 | 520 | 11.8 | 60 |
| Second Comparative | | | | | | | | | |
| Standard Terpolymer | 88% A1 | — | 12% C2 | 195 | 10.2 | 19.9 | 475 | 10 | 2 |

TABLE 2-continued

| | Mixture Portions | | | Mod. of elas./ MPa | Mechanical Properties | | | | |
|---|---|---|---|---|---|---|---|---|---|
| | | | | | STSP/ MPa Yield | RFK/ Mpa Ultimate | RD in % Elong @ | | Critical Shear |
| Mixture | Portion A | Portion B | Portion C | | Stress | Tensile | Tear | MFI$_O$ | Rate(s$^{-1}$) |
| Third Comparative | | | | | | | | | |
| Standard Terpolymer | — | 100% B4 | — | 185 | 9.0 | 25.3 | 520 | 12.7 | 31 |
| Fourth Comparative | | | | | | | | | |
| Standard Terpolymer | — | 100% B5 | — | 175 | 10.0 | 22.2 | 540 | 24 | 86 |
| 1 Mixture 1 | 43% A1 | 57% B2 | — | 171 | 9.2 | 20.8 | 495 | 11.2 | 110 |
| 2 Mixture 2 | 45% A2 | 55% B3 | — | 170 | 8.7 | 23.1 | 535 | 9.9 | 130 |
| 3 Mixture 3 | 50% A2 | 49% B2 | 1% C2 | 208 | 10.3 | 20 | 490 | 20 | 3500 |
| 4 Mixture 4 | 44% A2 | 54% B1 | 2% C2 | 209 | 8.8 | 20.8 | 530 | 22 | 1200 |
| 5 Mixture 5 | 43% A2 | 53% B1 | 4% C1 | 186 | 8.8 | 21.2 | 510 | 20 | 500 |
| 6 Mixture 6 | 44% A3 | 54% B3 | 2% C3 | 180 | 9.0 | 22.6 | 480 | 23 | 200 |

EXAMPLE 9

In this example, it is shown that when compared to uni-modal standard terpolymers, increased material throughput can be achieved during the tube extrusion operations. The following materials were compared:

Standard polymer B-4
Standard polymer B-5.
Mixture 6

Mixture 6 had an overall or combined MFI of 23 which was comparable to the MFI of terpolymer B5. The material were extruded under the conditions given below to form a uni-wall tube Screw diameter: 4 cm
Screw length: 96 cm
Compression ratio: 3:1
Die diameter: 1.00
Pindiameter: 0.920
Extrusion temperatures:
  Barrel
    Zone 1: 220C
    Zone 2: 235C
    Zone 3: 240C
  Head: 245 C
  Melt pump: 250 C
  Outflange: 250C
  Adapter: 250 C
  Die: 255 C.

The results of the extrusion trial in terms of extrusion output and critical shear rate are reported in Table 3.

TABLE 3

| Material | Extrusion Output (kg/hr) | Critical Shear Rate (s$^{-1}$) |
|---|---|---|
| B-4 | 2.93 | 31 |
| B-5 | 8.18 | 86 |
| Mixture 6 | 20.9 | 200 |

The data shown in Table 3 show that Mixture 6 could be processed without the appearance of surface defects to much higher output rates or shear rates than standard polymers B-4 and B-5. The data also indicates that the improvement in extrudability is more than 6-fold that for standard terpolymer B-4 and 3-fold that for standard terpolymer B-5. The latter comparison between Mixture 6 and standard polymer B-5 is especially relevant as both have similar MFI values.

EXAMPLE 10

In this example, it is shown that when tubes made with the standard terpolymer B1 are compared with tubes made with mixture 2 and 4, the latter retain equivalent burst strength, an added benefit above and beyond the ease of processing. The extruded tubes had an inside diameter of 10 mm and an outside diameter of 11.9 mm. The extrusion conditions were:

| Extruder data: | |
|---|---|
| Screw diameter: | 45 mm |
| Screw length: | 1232 mm |
| Compression ratio: | 1.2 |
| Extrusion die: | 55.9 mm |
| Mandrel: | 44.7 mm |
| Temperature control: | |
| Cylinder 1 (feed): | 150° C. |
| Cylinder 2: | 160° C. |
| Cylinder 3: | 175° C. |
| Cylinder 4: | 180° C. |
| Cylinders 5 through 7: | 185° C. |
| Flange: | 185° C. |
| Head: | 185° C. |
| Extrusion die: | 182° C. |

The burst resistance of the tubes was measured using a bursting pressure test device in which a firmly screwed down plastic tube was filled with water and placed under pressure by means of a pneumatic pump. The pressure test was considered to have been passed if, at a test pressure which is dependent on the dimensions of the tube, the tube withstood a pressure holding time of 6 minutes with no damage. After this test had been completed, the pressure was increased by 2 bar/min until the tube burst in order to determine the residual bursting strength. The material output, cold bursting pressure and modulus of elasticity in MPA are all reported in Table 3. As can be seen, mixtures 2 and 4 showed virtually no reduction in burst resistance when compared to that of standard terpolymer B1. Furthermore, there was an improvement in material throughput and modulus of elasticity.

TABLE 3

|  | B1 | Mixture 2 | Mixture 4 |
|---|---|---|---|
| Material output (kg/h) | 5.9 | 8.0 | 7.4 |
| Cold bursting pressure (Bar) | 17.0 | 16.5 | 17.2 |
| Modulus of elasticity (MPA) | 73.8 | 89.7 | 76.8 |

EXAMPLE 11

In this example, it is shown that the material throughput during coextrusion with polyamide can be more than tripled with the materials produced in accordance with the invention. Surprisingly, the end use properties of the extruded tubes were not reduced, while the processing speeds were markedly improved. Burst resistance and fuel permeation, two key properties in fuel line hoses and tubes, were not impaired.

Mixtures 3 and 4 were coextruded along with nylon 12 on a three-layer extrusion facility, and were compared with standard terpolymer B1. The structure of the layers is as follows:

Inner layer: Terpolymer

Center layer: Grilamid L 20 HV1 natural (bonding agent), firm of EMS Chemie

Outer layer: Grilamid L 25 W 40 X black 9992, firm of EMS Chemie.

The diameter of the hoses was set to 8.0 mm, the layer thickness of the hoses was 1.0 mm each. Smooth inner layers were made for each of the three terpolymers.

At the given extruder settings, terpolymer B1 could only be processed at a discharge speed of less than 20 m/min; melt fracture occurred on terpolymer B1 at higher extrusion speeds, and the inner layer of terpolymer B1 became rough.

With Mixtures 3 and 4, the extrusion speed could be tripled, and even at a discharge speed of 60 m/min no melt fracture was seen on the terpolymer inner layer.

The extruded tubes were tested for their burst resistance at 25° C. and 90° C. in the same way as in Example 10. In addition, the gasoline permeation rates were measured on these tubes.

To measure the permeation, the tubes were placed under a load of up to 2 bar at 60° C. using CM25 fuel (Fluid C solvent naphtha +25% methanol). The permeation was determined from the fuel mass weight loss per length of hose per day (g/m-d).

TABLE 4

|  | B1 | Mixture 3 | Mixture 4 |
|---|---|---|---|
| Bursting pressure (25° C. in Bar) | 57.7 | 68.0 | 63.2 |
| Bursting pressure (90° C. in Bar) | 28.9 | 32.0 | 29.7 |
| Permeation in g/m-d | 1.2 | 0.8 | 1.0 |

The data exhibited in Table (4) indicate that Mixture 4 compares very well with commercially available THV 500 with equivalent permeation characteristics at 60° C. and burst resistance at 25° C. and 90° C.

EXAMPLE 12

In this example, the influence of the ultrahigh molecular component C is demonstrated. The melt-granulated products of Mixtures 2 and 4 were compared with standard terpolymer B1 in pellet form (MFI 11.8). Injection molded plates of each material were made. Each plate had the dimensions 50×45×2 mm. Further, it is also shown that no disadvantages occur in terms of the mechanical properties, even at high injection speeds. Settings of the injection molding machine:

| Heating: | |
|---|---|
| Temperature in Zone 1 (feed): | 240° C. |
| Temperature in Zone 2: | 280° C. |
| Temperature in Zone 3: | 310° C. |
| Temperature in Zone 4 injection die): | 310° C. |
| Injection pressure: | 37 bar (3.7 × 10$^6$ Pa) |
| Injection speed: | More than 6 mm/s (see table) |
| Tool temperature: | 75° C. |

The degradation which occurred in conjunction with this was assessed. Under the injection conditions which was studied, the materials in accordance with the invention, just like the standard terpolymer B1, showed no measurable degradation of molecular weight. The MFI of the molded objects remained the same, and was not dependent on the injection conditions.

As the results which are summarized in the following table show, the material of Mixture 4 could be processed at injection speeds that are at least ten times higher than the standard terpolymer B1 without any visible defects occurring on the molded objects. The material of Mixture 2 could be processed 50% faster than the standard terpolymer B1, in contrast to Mixture 2, Mixture 4 contained an ultrahigh molecular component C at a level of 2% by weight.

TABLE 5

|  | B1 | Mixture 2 | Mixture 4 |
|---|---|---|---|
| Plunger Speed | Assessment of the molded plates | Assessment of the molded plates | Assessment of the molded plates |
| 6 mm/s | Perfect molded plates | Perfect molded plates | Perfect molded plates |
| 8 mm/s | Perfect molded plates | Perfect molded plates | Perfect molded plates |
| 10 mm/s | Overshearing at the edges | Slight onset of overshearing at the edges | Perfect molded plates |

TABLE 5-continued

| | B1 | Mixture 2 | Mixture 4 |
|---|---|---|---|
| 15 mm/s | Clear overshearing at the edges | Overshearing at the edges | Perfect molded plates |
| 22 mm/s | Overshearing at the edges, plus delamination | Overshearing at the edges, onset of delamination | Perfect molded plates |
| 32 mm/s | Severe overshearing and delamination, tearing off of the gate marks | Overshearing at the edges, onset of delamination | Perfect molded plates |
| 45 mm/s | — | Severe delamination at the gate marks, but no tearing off of the gate marks | Perfect molded plates |
| 60 mm/s | — | — | Perfect molded plates |
| 80 mm/s | — | — | Perfect molded plates |
| 110 mm/s | — | — | Perfect molded plates |

The mechanical properties were measured in accordance with DIN 53455 (ISO 12086-2) in both the longitudinal and transverse directions on test samples punched from the injection molded plates. The results are shown in the following table, where the abbreviations stand for the following:

STSP: Yield stress in MPa
RFK: Ultimate tensile strength
RD: Elongation at break in %.

TABLE 6

| | B1 at 10 mm/s | | Mixture 2 at 10 mm/s | | Mixture 4 at 10 mm/s | | Mixture 4 at 110 mm/s | |
|---|---|---|---|---|---|---|---|---|
| | long. | transv. | long. | transv. | long. | transv. | long. | transv. |
| STSP | 9.7 | 10.2 | 10.2 | 9.8 | 9.8 | 9.8 | 9.8 | 9.8 |
| RFK | 16.8 | 23.1 | 15.4 | 23.0 | 17.9 | 19.4 | 15.1 | 19.1 |
| RD | 306 | 525 | 227 | 576 | 356 | 557 | 301 | 551 |

As can be seen from this data, even at very high injection speeds (110 mm/s), practically no worsening of the mechanical properties was found. Furthermore, as the comparison of the mechanical data in the longitudinal and transverse directions shows, there was also no discernible orientation, otherwise the mechanical data of Mixture 4 would have been markedly different in the longitudinal and transverse directions at 10 mm/s and 110 mm/s.

EXAMPLE 13

In this example, the melt-granulated product of Mixtures 2 and 4 are compared with the B1 terpolymer in pellet form (MFI 11.8) for the injection molding of spirals. In conjunction with this, the improved flowability of the material in accordance with the invention is shown, and the special influence of the ultrahigh molecular component C is made clear once again.

During the injection molding of spirals, the longer the path that is traveled before the melt hardens, the better the flowability of the thermoplastics being studied. The injection conditions are as follows:

| Heating: | |
|---|---|
| Temperature in Zone 1 (feed): | 240° C. |
| Temperature in Zone 2: | 280° C. |
| Temperature in Zone 3: | 310° C. |
| Temperature in Zone 4 injection die): | 310° C. |
| Injection pressure: | 37 bar (3.7 × $10^6$ Pa) |
| Injection speed: | More than 6 mm/s (see table) |
| Tool temperature: | 75° C. |

As the data which are summarized in the following table show, the material of Mixture 4 possessed 45% better flowability than the B1 terpolymer. Despite that, Mixture 4 exhibited neither melt fracture nor delamination throughout the entire available speed range. By contrast, the overshearing of the B1 terpolymer was already pronounced at an injection speed of 8 mm/s.

Despite being bimodal, the material of Mixture 2 showed an improvement in flowability of only about 10% when compared with the B1 terpolymer. The presence of the ultrahigh molecular component C in Mixture 4 made its presence known through the markedly different flow behavior of Mixtures 2 and 4.

TABLE 7

| | B1 | | | Mixture 2 | | | Mixture 4 | | |
|---|---|---|---|---|---|---|---|---|---|
| Plunger speed | Length (cm) | Overshear (cm) | Delamin. | Length (cm) | Overshear (cm) | Delamin. | Length (cm) | Overshear (cm) | Delamin. |
| 6 mm/s | 18.8 | no | no | 20.2 | none | no | 26.0 | none | no |
| 8 mm/s | 19.2 | up to 3.5 | no | 20.6 | up to 11.0 | no | 26.8 | none | no |
| 10 mm/s | 19.2 | up to 5.5 | no | 20.5 | up to 11.0 | no | 27.1 | none | no |
| 15 mm/s | 19.1 | up to 7.8 | no | 20.5 | up to 11.0 | no | 27.4 | none | no |
| 22 mm/s | 19.1 | up to 8.0 | yes | 20.5 | up to 11.0 | no | 27.5 | none | no |
| 32 mm/s | 19.0 | up to 8.1 | yes | 20.5 | up to 11.2 | no | 27.5 | none | no |
| 45 mm/s | — | — | — | 20.5 | up to 11.2 | no | 27.5 | none | no |

TABLE 7-continued

| Plunger speed | B1 | | | Mixture 2 | | | Mixture 4 | | |
|---|---|---|---|---|---|---|---|---|---|
| | Length (cm) | Overshear (cm) | Delamin. | Length (cm) | Overshear (cm) | Delamin. | Length (cm) | Overshear (cm) | Delamin. |
| 60 mm/s | — | — | — | — | — | — | 27.5 | none | no |
| 80 mm/s | — | — | — | — | — | — | 27.4 | none | no |
| 110 mm/s | — | — | — | — | — | — | 27.3 | none | no |

EXAMPLE 14

In this example, Mixture 6 was used as the base material in compounding a series of electrostatic dissipative (ESD) terpolymers. ESD materials are defined in this case as having a surface resistivity <$10^6$ ohms/sq. Several ESD compositions were made using both standard terpolymer B-5 and Mixture 6. The ESD compositions were prepared by mixing the designated quantity of terpolymer with the designated amount of carbon black (XC-72 from Cabot) and the designated amount of polyethylene (Exxon 5252.09). Samples B5, ESD-1, ESD-2 and ESD-3 represent comparative examples. Mixture 6 represents a non-ESD composition of the invention. Samples ESD-4, ESD-5 and ESD-6 represent ESD compositions of the invention. The terpolymers were tested for various physical properties as described above. The results of these tests are reported in Table 8.

Surface Resistivity was measured according to ASTM D-257.

Permeation Constant was measured according to ASTM D-814.

A comparson of ESD materials made using B-5 to those made jusing Mixture 6 indicate that the ease of processing binefits observed with Mixture 6 itself can also be observed in the case of ESD materials made using Mixture 6 as the base polymer. As well, the quality of the dispersion for ESD-4, 5, and 6 is comparable to that for ESD-1,2, and 3 as indicated by a visual inspection of 0.12 mm films and the surface resistivity measurements. This is especially surprising as all ESD materials were compounded under the same conditions and considering that Mixture 6 contains 44% of a very low viscosity polymer (MFI=380). It is noteworthy that the procesing benefits for the ESD materials are not

TABLE 8

ESD formulations and properties

| | B-5 | Mixture 6 | ESD-1 | ESD-2 | ESD-3 | ESD-4 | ESD-5 | ESD-6 |
|---|---|---|---|---|---|---|---|---|
| B-5 (WT %) | | | 91 | 90.5 | 90 | | | |
| Mixture 6 (WT %) | | | | | | 91 | 90.5 | 90 |
| XC-72 (WT %) | | | 9 | 9 | 9 | 9 | 9 | 9 |
| Exxon 5252.09 Polyethylene (WT %) | | | 0 | 0.5 | 1.0 | 0 | 0.5 | 1.0 |
| MFI 265 C/5 kg | 24 | 23 | 8.8 | 9.0 | 8.0 | 8.2 | 9.4 | 9.8 |
| Dispersion (0–10) | — | — | 8 | 8.5 | 7 | 8 | 8.5 | 7.5 |
| Surface Resistivity (10 Area Draw Down Ratio) No stretch | — | — | $6 \times 10^4$ | $2 \times 10^4$ | $1.6 \times 10^3$ | $2 \times 10^5$ | $2 \times 10^4$ | $4 \times 10^3$ |
| Surface Resistivity (10 Area Draw Down Ratio) 30% stretch | — | — | $7 \times 10^9$ | $4.5 \times 10^6$ | $1.6 \times 10^5$ | $1.2 \times 10^7$ | $9 \times 10^5$ | $1.4 \times 10^6$ |
| RFK | 28.32 | 22.6 | 23.2 | 22 | 16.8 | 20.2 | 20.4 | 19.3 |
| RD | 539 | 480 | 430 | 480 | 490 | 430 | 390 | 460 |
| Permeation Constant (g-mm/m$^2$-day) CM15 @ 37C | 1.24 | 1.32 | 1.30 | 1.29 | 1.49 | 1.26 | 1.34 | 1.36 |
| Onset of melt fracture (1/s) | 80 | >250 | 70 | 70 | 90 | >250 | >250 | >250 |

The quality of the dispersion (Dispersion) was determined visually and given a value of from 0 to 10. A value of 0 means a bad dispersion while a value of 10 means an excellent dispersion.

achieved at the expense of mechanical properties such as tensile strength at break and elongation at break. Finally, the ESD compositions have permeation comstant values that are equivalent to those of the base polymers.

EXAMPLE 15

The following examples illustrate the use of the terpolymer composition of the invention to improve the extrusion characteristics of polyolefins. The time required to eliminate melt fracture during blown film extrusion of linear low density polyethylene (LLDPE) was reduced significantly with the use of polymer composition of the invention.

Masterbatches containing 3% of the terpolymer composition of the invention were prepared by dry blending the terpolymer powder and polyethylene pellets, compounding on a twin screw extruder, then pelletizing. The polyethylene used was a commercially available, 1.0 melt index butene linear low-density polyethylene (LLDPE) (0.918 density).

The terpolymer mixture contained 10 weight percent of a low molecular weight terpolymer (MFI of 130) and 90 weight percent of high molecular weight terpolymer (MFI of 10).

Three terpolymer compositions were evaluated. PPA 1 comprised the high molecular weight component (B-6) alone. PPA 2 comprised the mixture described above. PPA 3 comprised the low molecular weight component (A-4) alone.

For the blown film extrusion studies, an appropriate amount of masterbatch pellets were tumble blended with polyethylene to give levels of 700 ppm process aid. Experiments were carried out on a 4.44 cm lab-scale blown film line with a 40 mm grooved feed extruder. The blown film line was equipped with a screw having a length/diameter ratio of 24/1, an 18/35/60 mesh screen pack, a 40 mm die with a 2 mm die gap, and a single lip air ring. The extruder temperature profile was adjusted to give a target die temperature of 188° C. The film line output was 12 kg/h. The shear rate was 600 s$^{-1}$.

Process aid performance was assessed based on % melt fracture measured in film samples at regular intervals.

TABLE 9

| Process Aid Composition | Melt Fracture Elimination Time (minutes) |
|---|---|
| PPA 1 (100 wgt. % B-6) | 100 |
| PPA 2 (90 wgt. % B-6/10 wgt. % A-4) | 65 |
| PPA 3 (100 wgt. % A-4) | 100 (1% melt fracture-never cleared) |

Process aid performance was identical with both the high and low molecular weight components, while a blend of the two showed very enhanced performance.

EXAMPLE 16

Example 15 was repeated using a different commercially available linear low density polyethylene resin (1.0 g melt index octene 0.920 density) as the host polymer. The PPA compositions and the level of melt fracture at 120 minutes are reported in Table 10. The extruder temperature profile was adjusted to give a target die temperature of 221° C.

TABLE 10

| Process Aid Composition | Melt Fracture at 120 min. (%) |
|---|---|
| PPA 1 (100 wgt. % B-6) | 40 |
| PPA 5 (75 wgt. % B-6/25 wgt. % A-4) | 3 |

TABLE 10-continued

| Process Aid Composition | Melt Fracture at 120 min. (%) |
|---|---|
| PPA 6 (90 wgt. % B-6/10 wgt. % A-4) | 2 |
| PPA 7 (65 wgt. % B-6/35 wgt. % A-4) | 1 |

The data demonstrate that the multimodal terpolymer of the invention provides enhanced performance.

What is claimed:

1. A multimodal terpolymer that comprises a low molecular weight Component A having a low melt flow index (MFI$_A$), a high molecular weight Component B having a high melt flow index (MFI$_B$), and optionally an ultra-high molecular weight Component C having a melt flow index (MFI$_C$), each component being derived from interpolymerized units of (i) vinylidene fluoride, (ii) at least two ethylenically unsaturated monomers of the formula CF$_2$=CFR$_f$, where R$_f$ is fluorine or perfluoroalkyl of 1 to 8 carbon atoms wherein the weight ratio of Component A to Component B is in the range of 1:99 to 99:1 and Component C comprises up to 15 weight % of the total weight of Component A and Component B, and wherein the ratio of MFI$_A$:MFI$_B$ is at least 2.

2. A multimodal terpolymer according to claim 1 wherein the ratio MFI$_A$:MFI$_B$ is in the range of 2:1 to 300:1.

3. A multimodal terpolymer according to claim 2 wherein the ratio MFI$_A$:MFI$_B$ is in the range of 100:1 to 300:1.

4. A multimodal terpolymer according to claim 2 wherein the ratio MFI$_A$:MFI$_B$ is in the range of 2:1 to 100:1.

5. A multimodal terpolymer according to claim 1 wherein the weight ratio of Component A to Component B is in the range of from 1:99 to 20:80.

6. A multimodal terpolymer according to claim 5 wherein the weight ratio of Component A to Component B is in the range of from 75:25 to 25:75.

7. A multimodal terpolymer according to claim 1 wherein MFI$_A$ is greater than 50, MFI$_B$ is from 1 to 50, and MFI$_C$ is less than 1.

8. A multimodal terpolymer according to claim 1 wherein the terpolymer comprises interpolymerized units derived from (i) vinylidene fluoride, and (ii) at least two separate ethylenically unsaturated monomers of the formula $$CF_2=CFR_f$$

where R$_f$ is fluorine or a perfluoroalkyl of from 1 to 3 carbon atoms.

9. A multimodal terpolymer according to claim 8 wherein the terpolymer is derived from (i) vinylidene fluoride and (ii) tetrafluoroethylene and hexafluoropropylene.

10. A multimodal terpolymer according to claim 9 wherein the terpolymer is derived from a monomer combination of 5 to 55 weight % vinylidene fluoride, 30 to 70 weight % tetrafluoroethylene and 5 to 40 weight % hexafluoropropylene.

11. A multimodal fluoropolymer composition comprising the terpolymer according to claim 1 and from 2 to 20 weight % of a conductive material, and from 0 to 5 weight % of a melt processable hydrocarbon polymer.

12. A multimodal floropolymer composition according to claim 11 wherein the conductive material is selected from graphite and carbon black.

13. An article comprising the extruded multimodal terpolymer according to claim 1.

14. A multilayer article comprising a first layer of the terpolymer of claim 1 and a second thermoplastic or elastomeric layer.

15. A multilayer article according to claim 14 wherein the terpolymer further comprises from 2 to 20 weight percent of a conductive material.

16. A multilayer article according to claim 14 wherein a tie layer is used to join the terpolymer to the second layer.

17. A multimodal terpolymer according to claim 1 wherein $MFI_A$ is greater than 100, $MFI_B$ is from 1 to 100, and $MFI_C$ is less than 1.

* * * * *

UNITED STATES PATENT AND TRADEMARK OFFICE
CERTIFICATE OF CORRECTION

PATENT NO. : 6,242,548 B1
DATED : June 5, 2001
INVENTOR(S) : Denis Duchesne, Harald Kaspar, Gernot Löhr, Attila Molnar, Klaus Hintzer, Maria P. Dillon, Susan S. Woods, Kirsten J. Fronek, Friedrich Kloos and Ludwig Mayer It is certified that error appears in the above-identified patent and that said Letters Patent is hereby corrected as shown below:

<u>Title page,</u>
Item [75] Inventors, "Attila A. Monar" should be -- Attila Molnar --; and -- Ludwig Mayer, Burgkirchen (DE) -- should be added to the list of inventors as shown on the corrected Declaration and Assignment documents and supporting documentation filed with the USPTO on March 15, 2000.

<u>Column 6,</u>
Line 5, "nylon4," should be -- nylon-4, --.
Line 23, "thereof Chain extenders" should be -- thereof. Chain extenders --.

<u>Column 11,</u>
Line 41, "Pindiameter:" should be -- Pin diameter: --.

<u>Column 18,</u>
Line 18, "jusing" should be -- using --.
Line 19, "binefits" should be -- benefits --.

Signed and Sealed this

Twenty-eighth Day of May, 2002

*Attest:*

JAMES E. ROGAN
*Attesting Officer*     *Director of the United States Patent and Trademark Office*